(12) United States Patent
Bailey et al.

(10) Patent No.: US 10,555,440 B2
(45) Date of Patent: Feb. 4, 2020

(54) RACK LEVEL AIR FLOW BAFFLE PROVIDING HOT AISLE SEPARATION FROM RACK-INSERTED IT COMPONENTS

(71) Applicant: DELL PRODUCTS, L.P., Round Rock, TX (US)

(72) Inventors: Edmond I. Bailey, Cedar Park, TX (US); Steven Embleton, Austin, TX (US); Rene J. Salas, Round Rock, TX (US)

(73) Assignee: Dell Products, L.P., Round Rock, TX (US)

(*) Notice: Subject to any disclaimer, the term of this patent is extended or adjusted under 35 U.S.C. 154(b) by 983 days.

(21) Appl. No.: 14/509,009

(22) Filed: Oct. 7, 2014

(65) Prior Publication Data

US 2016/0100506 A1 Apr. 7, 2016

(51) Int. Cl.
*H05K 7/20* (2006.01)

(52) U.S. Cl.
CPC ..... *H05K 7/20727* (2013.01); *H05K 7/20736* (2013.01)

(58) Field of Classification Search
CPC .......... H05K 7/20727; H05K 7/20736
USPC .......................................... 454/184
See application file for complete search history.

(56) References Cited

U.S. PATENT DOCUMENTS

| | | | |
|---|---|---|---|
| 7,857,688 B1* | 12/2010 | Cunningham | H05K 7/20736 361/679.01 |
| 8,804,374 B2* | 8/2014 | Gilliland | H05K 9/0041 174/66 |
| 2012/0009862 A1 | 1/2012 | Meyer | |
| 2012/0077427 A1* | 3/2012 | Wei | H05K 7/20745 454/184 |
| 2012/0134103 A1* | 5/2012 | Tan | H05K 7/20736 361/679.46 |
| 2013/0115869 A1* | 5/2013 | Alshinnawi | H05K 7/20736 454/184 |
| 2015/0282349 A1* | 10/2015 | Mann | H05K 5/0217 312/283 |

* cited by examiner

*Primary Examiner* — Edelmira Bosques
*Assistant Examiner* — Dana K Tighe
(74) *Attorney, Agent, or Firm* — Isidore PLLC

(57) ABSTRACT

An apparatus, an information handling system (IHS) and a method for supporting air flow management in a rack includes attaching a baffle made of a non-porous material with vertically-spaced apertures or air flow directing (AFD) sections with flanges that direct cooling air flow from heat dissipating electronic components of the rack towards a rear of the rack. The baffle is attached to a rear section of a chassis of the IHS. The baffle provides physical separation of (i) a cold aisle located towards a front section of the rack and the electronic components inserted into the rack chassis from (ii) a hot aisle located towards a rear of the rack. The flanges of the AFD section folds inward towards the electronic components to create a funnel for receiving a flow of cooling air from the hot aisle.

16 Claims, 9 Drawing Sheets

RACK LEVEL AIR FLOW BAFFLE PROVIDING HOT AISLE SEPARATION FROM RACK-INSERTED IT COMPONENTS

BACKGROUND

1. Technical Field

The present disclosure generally relates to information technology (IT) racks and in particular to configuration and design of air flow systems in IT racks.

2. Description of the Related Art

As the value and use of information continue to increase, individuals and businesses seek additional ways to process and store information. One option available to users is information handling systems. An information handling system (IHS) generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Large scale IHSes, such as servers, are often inserted placed within an information technology (IT) rack which is designed to support the weight and other requirements of the various IT components inserted within the rack. Among the considerations of these rack-based implementations is that of heat, as the IT components generate a significant amount of heat during operation and therefore must be cooled to remain functional. The cooling required for these rack mounted systems is conventionally provided by external fans place in or around the rack and which pull or push cooling air through the rack from a cold aisle (typically the front of the rack) to a hot aisle (typically the rear of the rack). With the current configurations of racks, some of the heated exhaust air circles back to the front of the rack, causing an increase in temperature of the cooling air on the cold aisle and ultimately reducing the cooling efficiency of the cooling system altogether. The back flow or re-circulation of hot air from the hot aisle back to the front of the rack can occur at the sides of the rack, which is often placed a few feet away from an adjacent rack within a rack server farm with a plurality of racks.

BRIEF SUMMARY

Disclosed are an apparatus, an information handling system (IHS), and a method for supporting air flow management in an information technology (IT) rack containing one or more IT gear of one or more information handling systems (IHSes). According to one aspect of the disclosure, a baffle is designed for use as a back panel of an IT rack and utilized to support air flow management. The baffle is made of a non-porous material having at least one aperture that operates as an air flow directing (AFD) section. The AFD includes inward-facing flanges, which direct the exhaust air generated from cooling air flow across heat dissipating electronic components of the IHS towards a physically separated/defined hot aisle area at the back (exterior) of the IT rack. The baffle is attached to a rear section of the rack chassis. The baffle provides physical separation of (i) a cold aisle located towards a front section of the rack and the electronic components inserted into the rack chassis from (ii) a hot aisle located towards a rear of the rack.

The flanges of the AFD section fold inward towards the back of the electronic components to create a funnel for receiving and directing a flow of exhaust air from the rack chassis. The flanges of the AFD section can be adhered to a rear section of an interior of the chassis. The AFD sections are located at specific vertical locations along the baffle correlating to vertically-spaced locations of the rack chassis at which the hot air exhaust, generated from passing cooling air over the functioning electronic components, can be efficiently directed away from the interior chassis section of the IT rack holding the IT gear.

According to one aspect of the disclosure, the baffle is constructed from corrugated cardboard, and the AFD apertures are cutout, perforated sections that fold inward.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
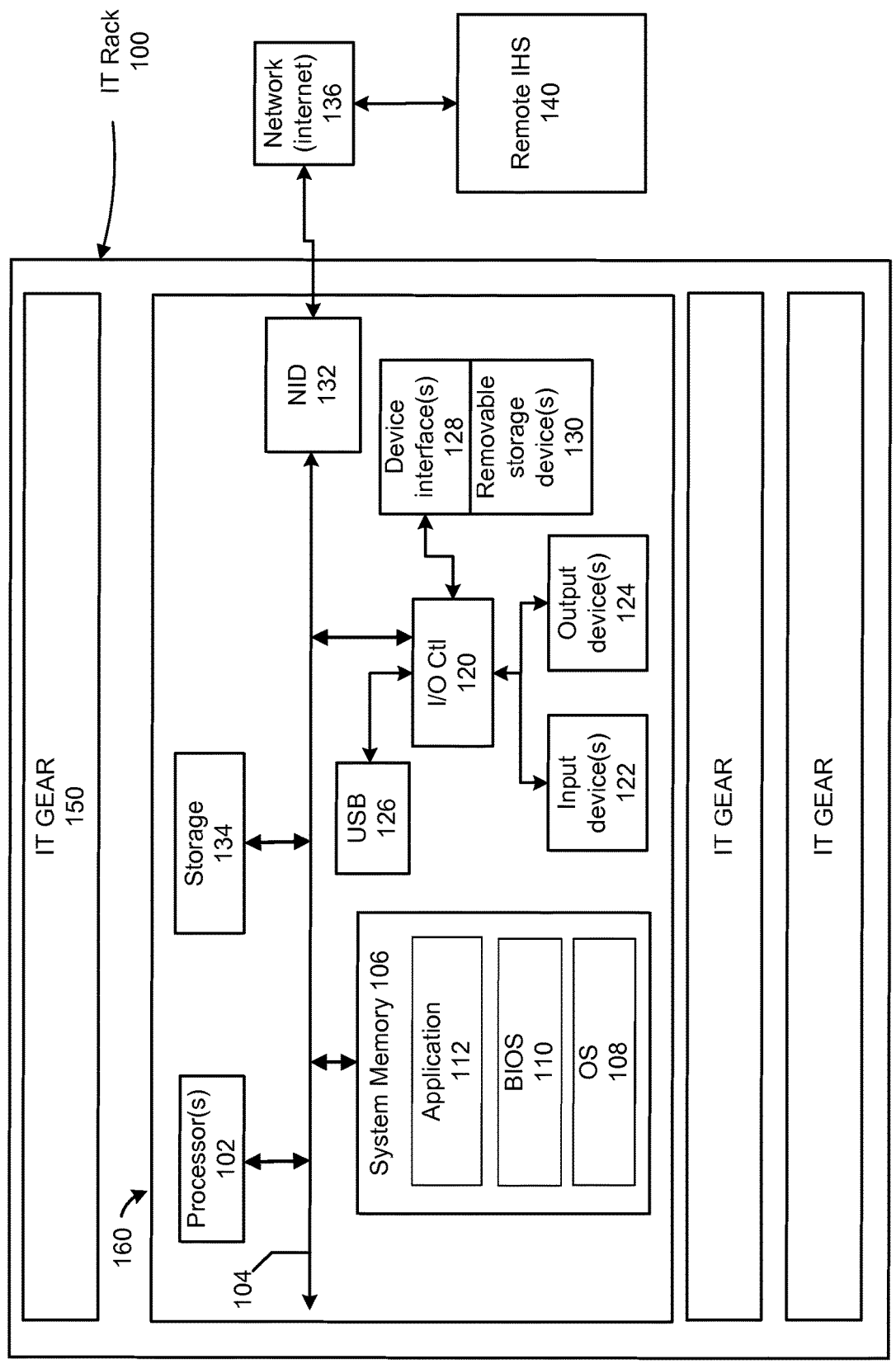
FIG. 1 is a block diagram illustration of an example information technology (IT) rack and functional components of an example information handling system (IHS) that can be one IT gear located within the representation of the rack, according to one or more embodiments.

The illustrative embodiments provide an apparatus, an information handling system (IHS) and a method for supporting air flow management in an information technology (IT) rack containing one or more IT gear of an information handling system (IHS). According to one aspect of the disclosure, a baffle is designed for use as a back panel of an IT rack and utilized to support air flow management. The baffle is made of a non-porous material having at least one aperture that operates as an air flow directing (AFD) section. The AFD includes inward-facing flanges, which direct the exhaust air generated from cooling air flow across heat dissipating electronic components of the IHS towards a physically separated/defined hot aisle area at the back (exterior) of the IT rack. The baffle provides physical separation of (i) a cold aisle located towards a front section of the rack and the interior rack chassis within which the electronic components are inserted from (ii) a hot aisle located towards a rear of the rack. The baffle is attached to a rear section of the rack chassis. The flanges of the AFD section fold inward towards the back of the electronic components to create a funnel for receiving and directing a flow of exhaust air from the rack chassis. The flanges of the AFD section can be adhered to a rear section of an interior of the chassis. The AFD sections are located at specific vertical locations along the baffle correlating to vertically-spaced locations of the rack chassis at which the hot air exhaust, generated from passing cooling air over the functioning electronic components, can be efficiently directed away from the interior chassis section of the IT rack holding the IT gear.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Those of ordinary skill in the art will appreciate that the hardware, firmware/software utility, and software components and basic configuration thereof depicted in the following FIGS. 1-6 and 8 may vary. The illustrative components of IHS 100 and MELS IT rack 200 and baffle 300 are not intended to be exhaustive, but rather are representative to highlight some of the components that are utilized to implement certain of the described embodiments. For example, different configurations of an IHS and/or a rack may be provided, containing other devices/components, which may be used in addition to or in place of the hardware depicted, and may be differently configured. Further, the baffle 300 can be differently configured, with different shaped openings and/or different vertical dimensions, for example. The depicted examples are therefore not meant to imply architectural or other limitations with respect to the presently described embodiments and/or the general disclosures provided herein.

FIG. 1 illustrates a block diagram representation of an example information handling system (IHS) 100, which represents one or more possible embodiments of the disclosure. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components. In the present disclosure, a rack structure utilized to support a rack-based information handling system is illustrated and described. Thus, within the description, the entire rack can be described as a single information handling system, although it is appreciated that the individual IT gear inserted within one chassis of the rack can be a separate information handling system from other IT gear within the larger rack.

Referring specifically to FIG. 1, there is illustrated a block diagram representation of an IT rack 100 (e.g., MELS IT rack 200, described hereafter) having multiple IT gear 150 inserted therein. As illustrated, at least one example IT gear is an IHS 160. IHS 160 includes one or more processor(s) 102 coupled to system memory 106 via system interconnect 104. System interconnect 104 can be interchangeably referred to as a system bus, in one or more embodiments. Also coupled to system interconnect 104 is storage 134 within which can be stored one or more software and/or firmware modules and/or data (not specifically shown). In one embodiment, storage 134 can be a hard drive or a solid state drive. The one or more software and/or firmware modules within storage 134 can be loaded into system memory 106 during operation of IHS 160. As shown, system memory 106 can include therein a plurality of modules, including Basic Input/Output System (BIOS) 110, operating system (O/S) 108, applications 112 and firmware (not shown). The various software and/or firmware modules have varying functionality when their corresponding program code is executed by processor(s) 102 or other processing devices within IHS 160. As illustrated, IHS 160 is located/placed within a larger structure of an IT rack 100 (generally illustrated in FIG. 1 as a surrounding exterior line). Specific structural details and method of assembling a MELS IT rack 200 are provided in FIGS. 2-6, 8 and 9).

In one or more embodiments, BIOS 110 comprises additional functionality associated with unified extensible firmware interface (UEFI), and can be more completely referred to as BIOS/UEFI 110 in these embodiments. The various software and/or firmware modules have varying functionality when their corresponding program code is executed by processor(s) 102 or other processing devices within IHS 160.

IHS 160 further includes one or more input/output (I/O) controllers 120 which support connection to and processing of signals from one or more connected input device(s) 122, such as a keyboard, mouse, touch screen, or microphone. I/O controllers 120 also support connection to and forwarding of output signals to one or more connected output device(s) 124, such as a monitor or display device or audio speaker(s). In addition, IHS 160 includes universal serial bus (USB) 126 which is coupled to I/O controller 120. Additionally, in one or more embodiments, one or more device interface(s) 128, such as an optical reader, a universal serial bus (USB), a card reader, Personal Computer Memory Card International Association (PCMCIA) port, and/or a high-definition multimedia interface (HDMI), can be associated with IHS 160. Device interface(s) 128 can be utilized to enable data to be read from or stored to corresponding removable storage device(s) 130, such as a compact disk (CD), digital video disk (DVD), flash drive, or flash memory card. In one or more embodiments, device interface(s) 128 can also provide an integration point for connecting other device(s) to IHS 160. In one implementation, IHS 160 connects to remote IHS 140 using device interface(s) 128. In such implementation, device interface(s) 128 can further include General Purpose I/O interfaces such as I²C, SMBus, and peripheral component interconnect (PCI) buses.

IHS 160 comprises a network interface device (NID) 132. NID 132 enables IHS 160 to communicate and/or interface with other devices, services, and components that are located external to IHS 160. These devices, services, and components can interface with IHS 160 via an external network, such as example network 136, using one or more communication protocols. In particular, in one implementation, IHS 160 uses NID 132 to connect to remote IHS 140 via an external network 136.

Network 136 can be a wired local area network, a wireless wide area network, wireless personal area network, wireless local area network, and the like, and the connection to and/or between network 136 and IHS 160 can be wired or wireless or a combination thereof. For purposes of discussion, network 136 is indicated as a single collective component for simplicity. However, it is appreciated that network 136 can comprise one or more direct connections to other devices as well as a more complex set of interconnections as can exist within a wide area network, such as the Internet.

It is especially important to note that during operation of IHS 160, many of the aforementioned components utilized electrical power and dissipate heat, causing the IHS 160 and by extension the interior of the rack 100 to experience an increase in temperature. Thus a cooling air is supplied to the rack and ultimately to the IHS 160 via one or more air movers (e.g. fans) that passes cooling air from a cold aisle over the IT gear 150/IHS 160 within the rack (or rack chassis) 100. The exhaust air that is generated then flows out the back of the rack 100. Aspects of the present disclosure addresses how the exhaust air is directed out of the rack chassis and kept from recirculating back to the IT gear 150/IHS 160 within the rack 100.

Figure 2:
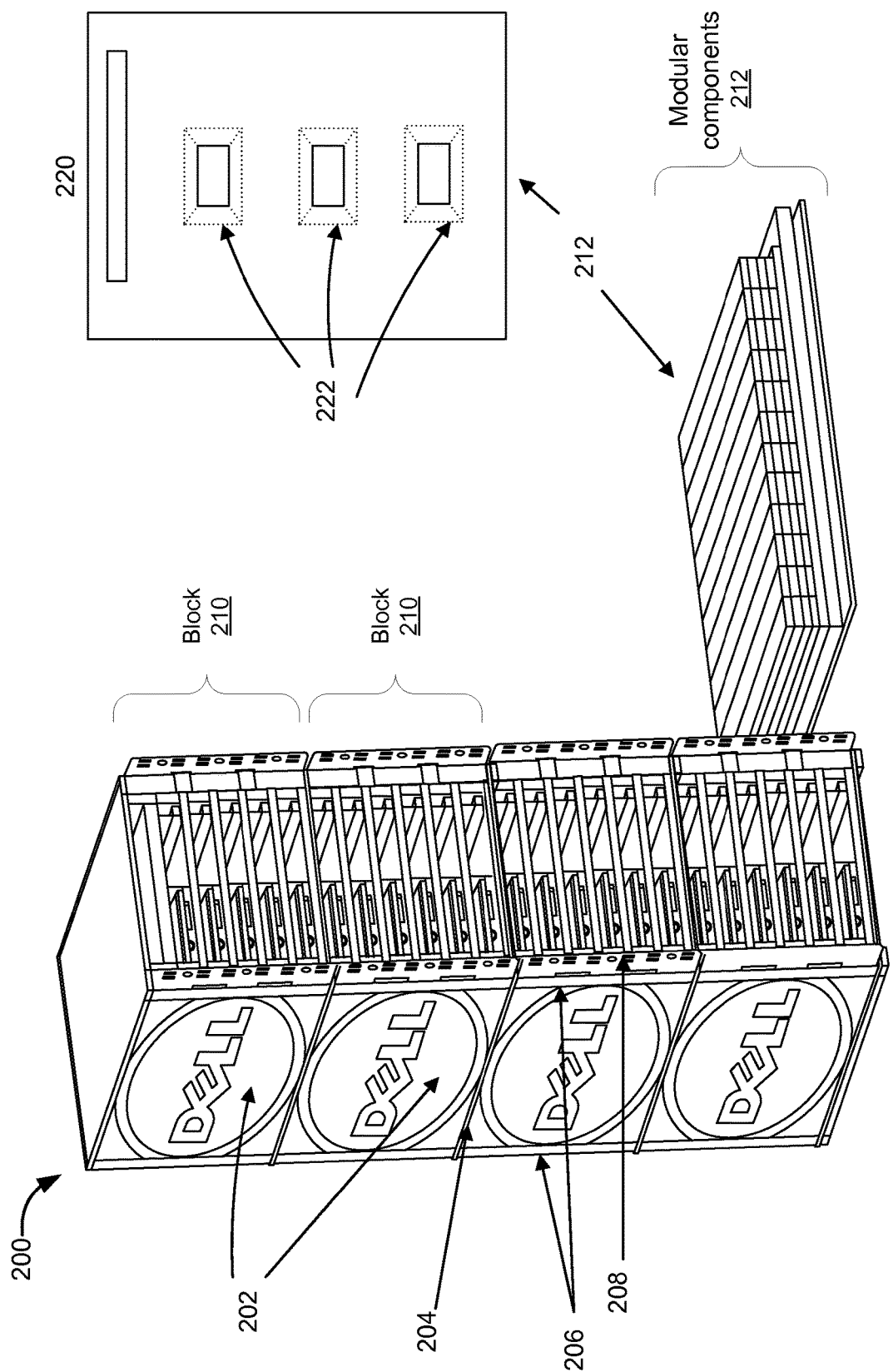
FIG. 2 illustrates a modular, easily-assembled, lightweight, and structurally-rigid (MELS) information technology (IT) rack assembly and a flat-packed representation of the sub-components thereof, according to one embodiment.

FIG. 2 illustrates an example MELS IT rack assembly, according to one embodiment. MELS IT rack 200 is assembled using modular components 212 which can be constructed using lightweight, structural material, such as corrugated cardboard material. Included within modular components 212 is one or more baffles 220. Rack 200 comprises modular tray grouping and enclosure (MTGE) units 202 which respectively enclose sub-groups of IT gear receiving (ITGR) trays and cable support components to create an MTGE block 210. Each MTGE block 210 includes a specific number of ITGR trays in which electronic components and/or IT gear 150 (FIG. 1) can be inserted/placed. In one embodiment, where the IT rack is a MELS IT rack, the panels can be sized according to a size of the modular IT rack and/or the sizes of the MTGE blocks 210. Using the modularity provided by these MTGE blocks 210 as the building blocks for MELS IT rack 200 allows the MELS IT rack 200 to be expanded or downsized by adding or removing one or more MTGE blocks 210 based on user/customer requirements of MELS IT rack 200 and/or vertical space limitations.

MELS IT rack 200 further comprises banding components 204 and vertical corner components 206. In addition, MELS IT rack 200 comprises cable support panels/components 208.

As illustrated, when include within the flat-packed components, baffle 220 includes perforated cut-out sections 222. As with others components of the MELS IT rack, baffle 220 can be constructed from corrugated cardboard or some other lightweight but rigid material, with the AFDs being perforated cut-outs (e.g., 222) that can be bent inwardly into final assembly shape. Once installed, in addition to provided air flow support, baffles 220 also provide some amounts of structural rigidity to the rear of the MELS IT rack. Baffle 220 is also identified herein as baffle 300, which is further described in FIG. 3. Additional details of a MELS IT rack can be found in commonly assigned U.S. patent application Ser. No. 14/506,325.

Figure 3:
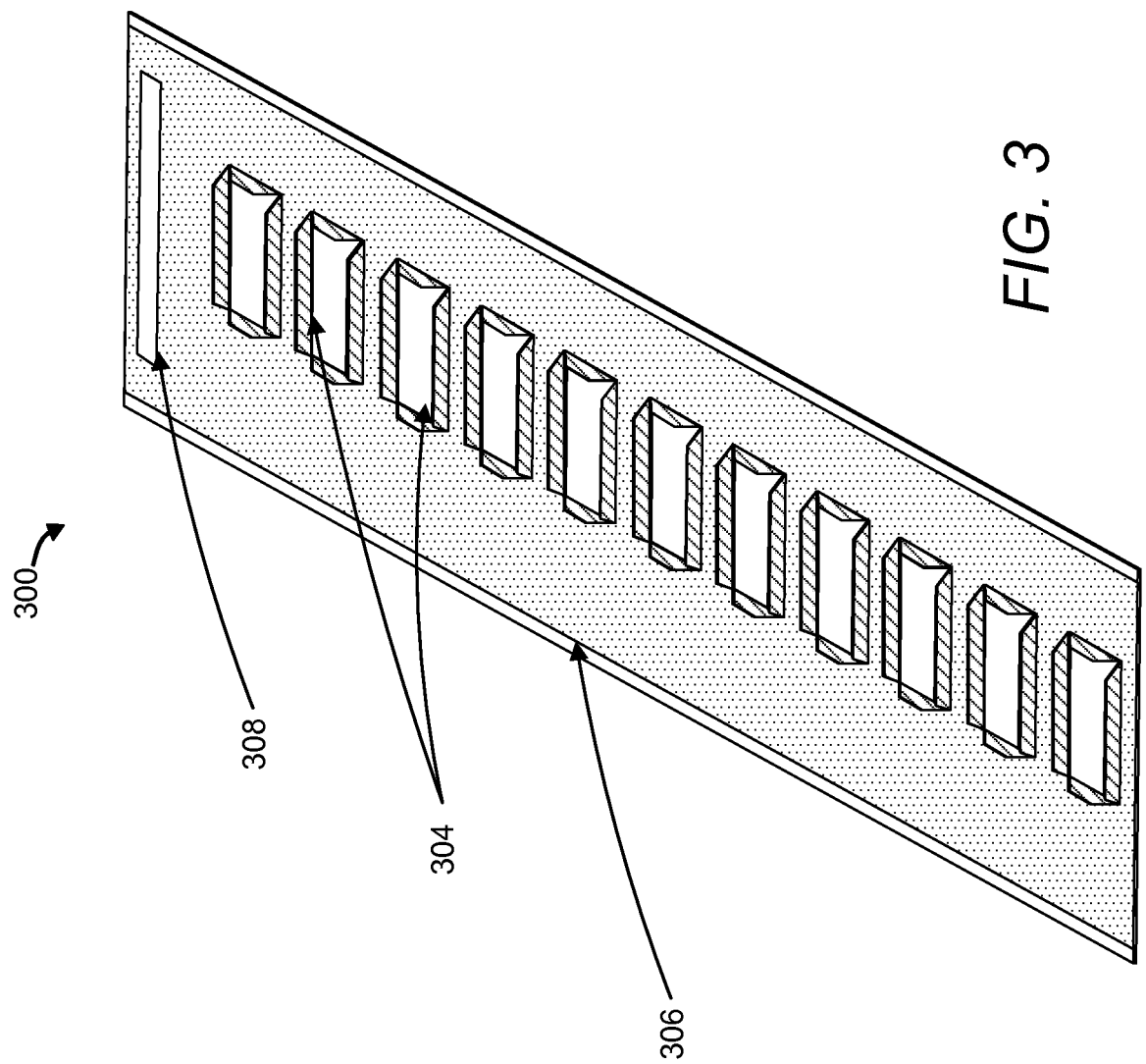
FIG. 3 illustrates a baffle that can be used in lieu of and/or as the back panel of the an IT rack, such as MELS IT rack, according to one embodiment.

FIG. 3 illustrates a baffle that can be used as a back panel of an IT rack, including the MELS IT rack 200, according to one embodiment. Baffle 300 is an air flow management support component having air flow directing (AFD) apertures 304 or holes with flanges that fold inwards towards the chassis of the IT rack. Baffle 300 also includes edge 306 and notch 308, which in one embodiment, is designed as a holding location to align and facilitate securing baffle 300 to the rack chassis. Baffle 300 is designed to guide airflow through the IT rack using the AFD apertures. Additionally, baffle 300 is specifically designed to enable physical separation of hot and cold aisles of the physical space within which the IT rack is located. Thus, baffle 300 is therefore referred to herein as hot aisle—cold aisle separator (HCS) baffle 300 to distinguish from other types of baffles that may be utilized for other purposes in the general IT area. In one embodiment, HCS baffle 300 is constructed from a lightweight material, such as corrugated cardboard, and the AFD apertures are cutout sections of the cardboard. In one or more embodiments, the AFD apertures are placed at specific vertical locations along the baffle to correlate to locations of the rack chassis at which the hot air exhaust from functioning IT gear can be effectively directed away from the section of the IT rack 200 holding the IT gear. With the HCS baffle 300 in place, the IT gear holding section of the MELS IT rack 200 is located at the front of the rack adjacent to the cold aisle, while the exhaust air is directed to a back section of the IT rack 200, which represents the hot aisle, on the opposite side of the HCS baffle 300 from the IT gear. The HCS baffle 300 prevents hot air that is directed through the AFD apertures 304 from re-circulating into the cold aisle section of the IT rack 200. HCS baffle 300 thus assists within maintaining a lower ambient temperature of the cold aisle. In one implementation, baffle 300 is affixed via adhesive edges 306 of baffle 300 to side panels 202 to provide a back panel of rack 200.

The AFD apertures 304 are specifically sized and positioned based on a chassis design to physically interface with a chassis of the rack in order to direct air-flow and/or provide separation for hot and cold aisles. The AFD apertures 304 of baffle 300 includes flanges or segments that fold inward at the apertures to direct or guide air flow out through the apertures. In one implementation, the inward folding segments are adhered to adjacent sections of the chassis.

Figure 4:
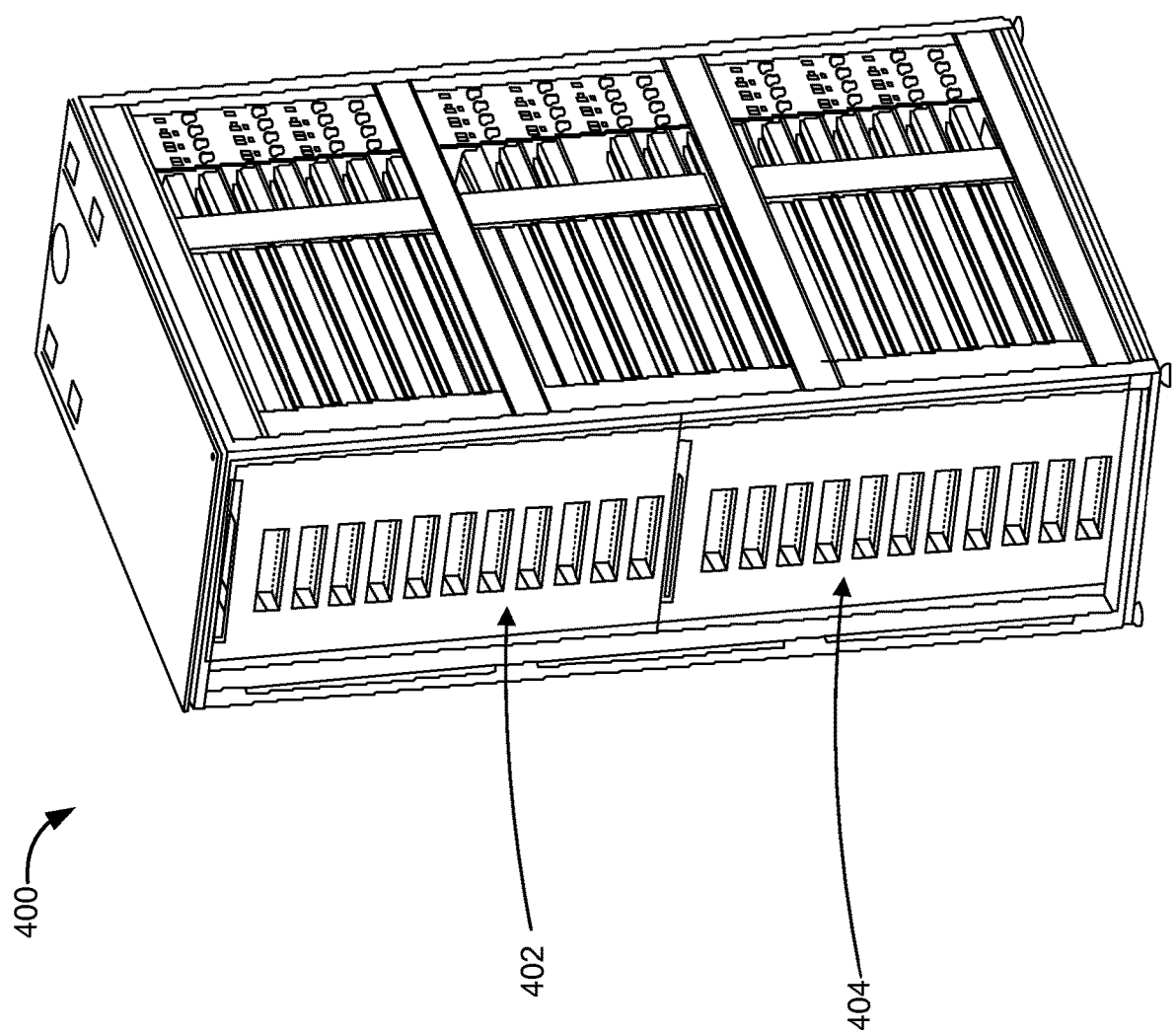
FIG. 4 is a first anterior view of a rack showing two attached baffles utilized for air flow directing and containment, according to one embodiment.
Figure 5:
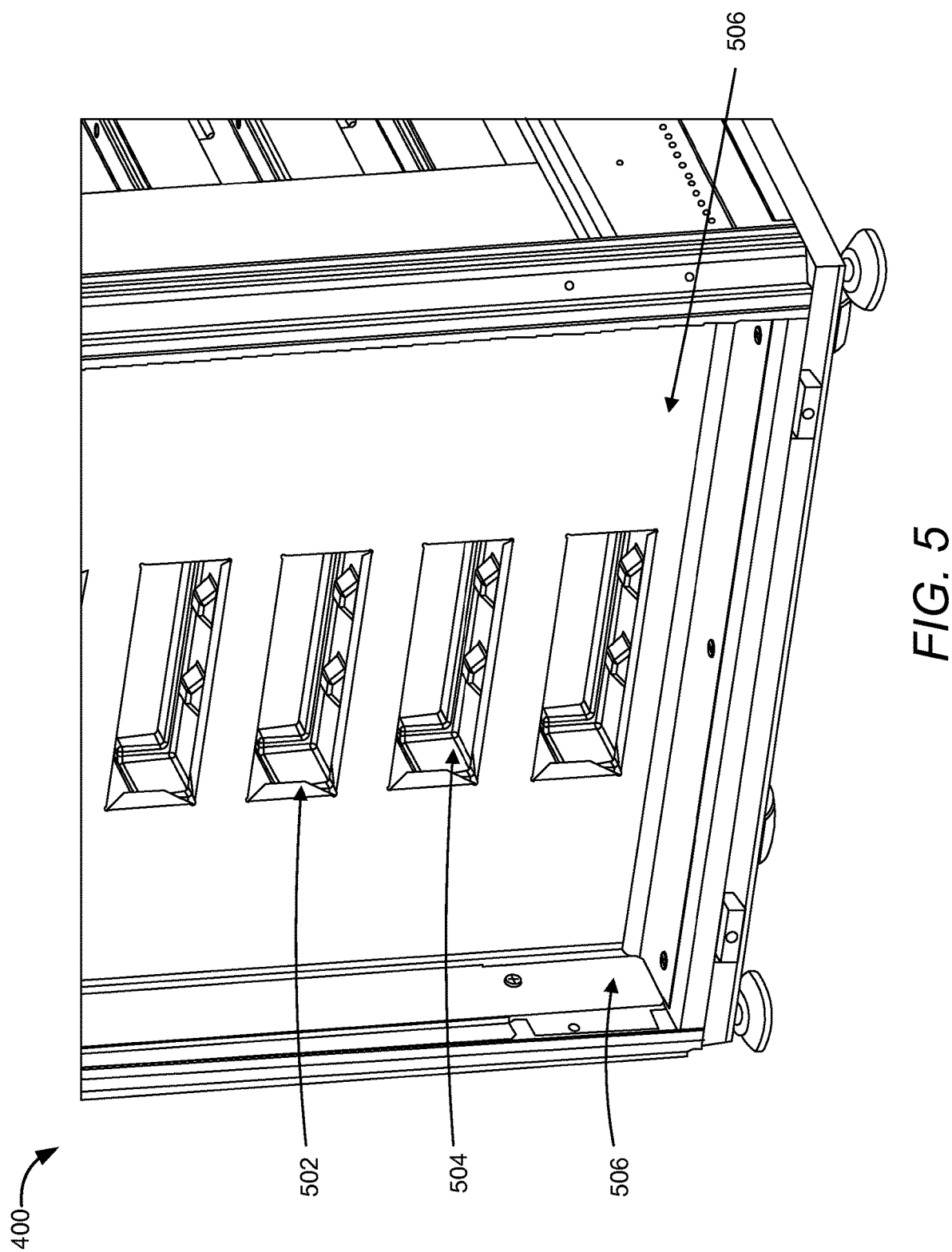
FIG. 5 is a second anterior view of the MELS rack showing additional details of the AFD and flanges of the baffle when attached to the rack chassis, according to one embodiment.

FIG. 4 is a first anterior view of a rack 400 showing two attached baffles utilized for air flow directing and containment, according to one embodiment. The two (or more) individual baffle components 402 and 404 can be provided as the back panel of the IT rack, and sized appropriately. FIG. 5 is a second anterior view of the rack 400 showing additional details of the AFD and flanges 502 of the baffle when attached to the rack chassis 504, according to one embodiment. Each baffle 402, 404 is adhered via adhesive edges of a corresponding baffle to one or more panels of IT rack 200 (such as the side panels 202) to collectively provide a back panel of IT rack 200. A hot aisle 506 is defined encompassing the entire vertical space along the back of the HCS baffle.

Figure 6:
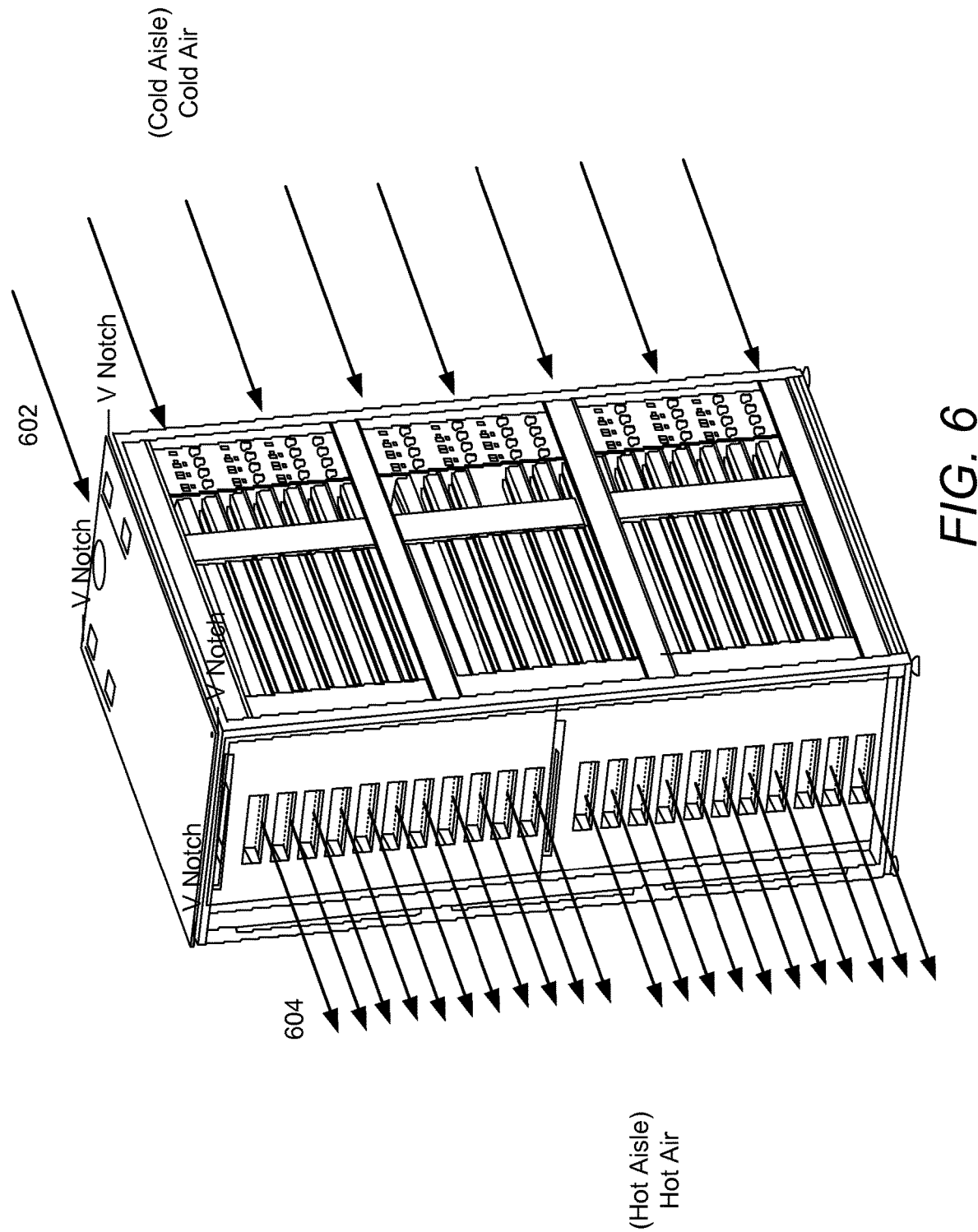
FIG. 6 illustrates the flow of cooling air from a front of the rack representing the cold aisle through the rack chassis containing the IT gear and then directed to the hot aisle at the back of the rack via the vertically-spaced AFDs of the baffle, according to one embodiment.

FIG. 6 illustrates the flow of cooling air from a front of the rack representing the cold aisle through the rack chassis containing the IT gear and then directed to the hot aisle at the back of the rack via the vertically spaced AFDs of the baffle, according to one embodiment. As illustrated in FIG. 6, cold air 602 flows from the cold aisle into a front section of the rack chassis and hot air 604 is guided out through the AFDs of the baffles towards the hot aisle at the rear section of the rack. As indicated via FIGS. 4-6, baffle 300, 402 and 404 includes segments 502 that fold inward at the AFD sections to enable air flow to be guided towards a back of the baffle 300 outwards and away from the IT gear located within the chassis of the IT rack 200. In one implementation, the inward folding segments 502 adhere to adjacent sections 504 of the chassis. In one or more related implementations, these adjacent chassis sections are anterior sections of MTGE blocks 210 (FIG. 2).

Figure 7:
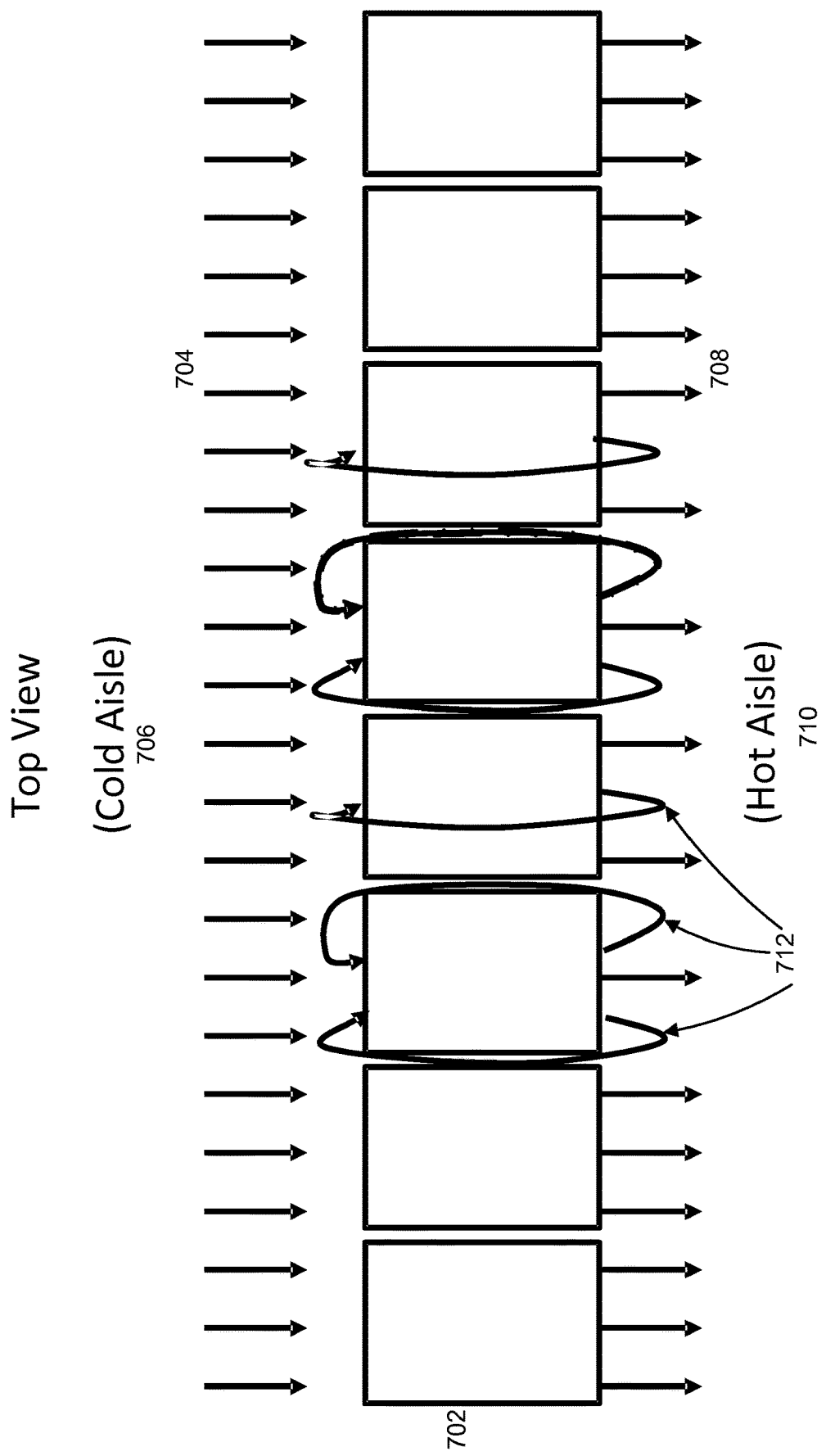
FIG. 7 is a bird's eye view of a conventionally spaced arrangement of a row of adjacent racks, according to the prior art.

FIG. 7 is a bird's eye view of a conventionally spaced arrangement of a row of adjacent racks, according to the prior art. Rack system 700 comprises individual racks 702. Also illustrated in rack system 700 are cold air flow 704 from a cold aisle 706, hot air flow 708 at hot aisle 710 and re-circulating hot air 712. In a traditional system, hot air 708 may re-circulate as re-circulating hot air 708 from the rear of the racks (hot aisle 710) to the front of the racks (cold aisle 706) causing an increase in the temperature of the IT gear and rack. This re-circulation may occur via spaces/passages between racks, through Electronics Industry Alliance (EIA) flanges and/or between servers.

Figure 8:
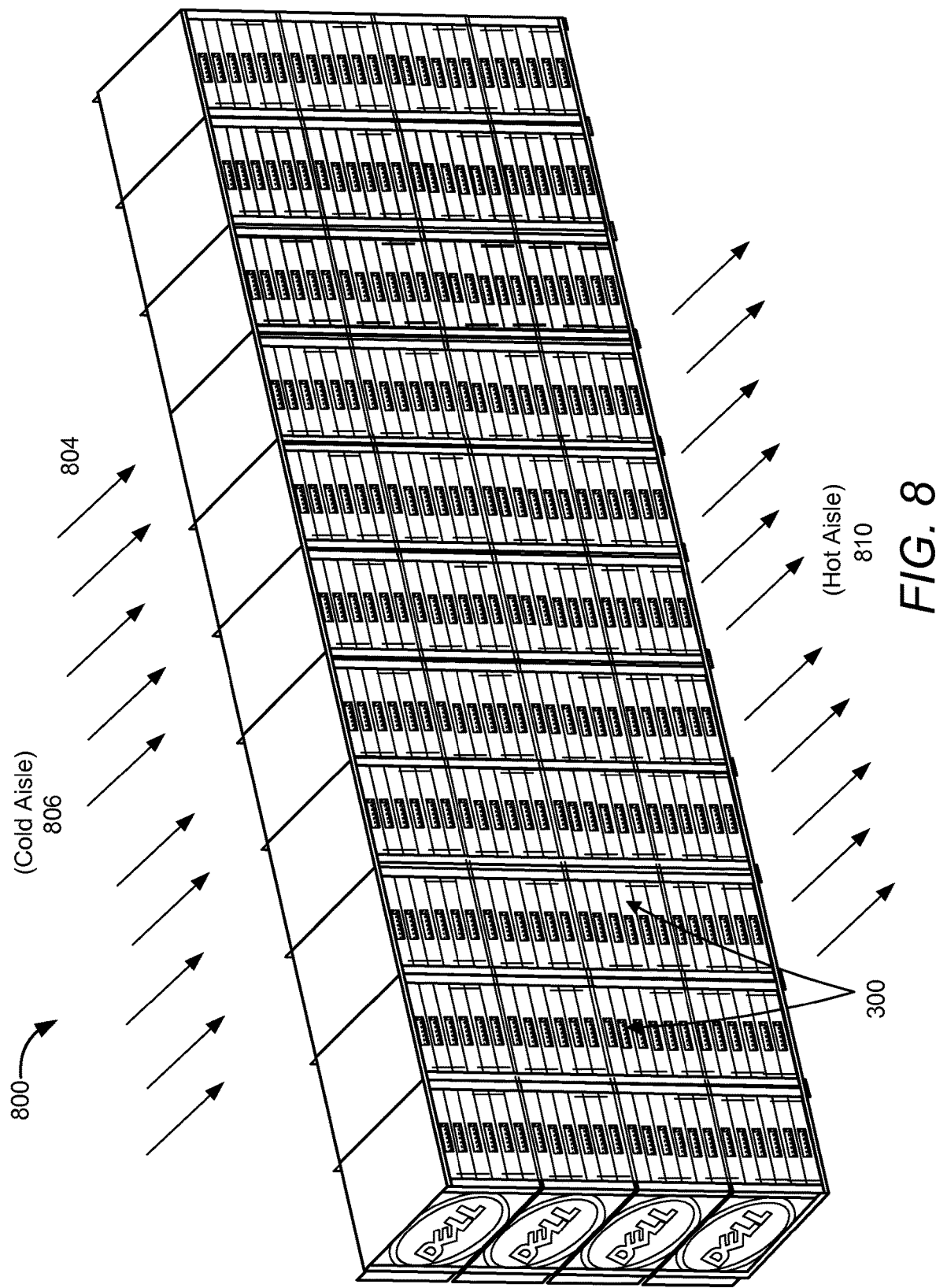
FIG. 8 is an anterior view of a horizontally stacked row of IT racks configured with baffles, according to one embodiment.

FIG. 8 is an anterior view of a horizontally stacked row 800 of IT racks configured with baffles, according to one embodiment. Horizontally stacked row 800 illustrates a row of IT racks, each of which is individually positioned to physically abut an adjacent IT rack to avoid a presence of gaps between any of the adjacent IT racks. Horizontally stacked row 800 effectively operates as a wall that allows air flow 804 in a first direction from cold aisle 806 towards hot aisle 810 and prevents and/or minimizes re-circulation of hot air from the hot aisle 810 back towards the cold aisle 806. Furthermore, the horizontally stacked row of IT racks prevents a reverse flow of exhaust air from the hot aisle back to the IT gear within the row of racks.

The specific functionality provided by use of the baffle allows the baffle to be fitted to a majority of conventional racks, as the baffle can be appropriately sized to fit on the back of these existing racks. The low profile of the design (i.e., relatively flat configuration, small dimension, and lightweight) allows the baffle to be easily shipped in bulk to be fitted on the backs of already deployed racks. According to one embodiment, the low profile of the baffle also lends itself to utilization within a flat packed rack assembly and particularly with a modular, easily-assembled, lightweight, and structurally-rigid (MELS) IT rack assembly.

Figure 9:
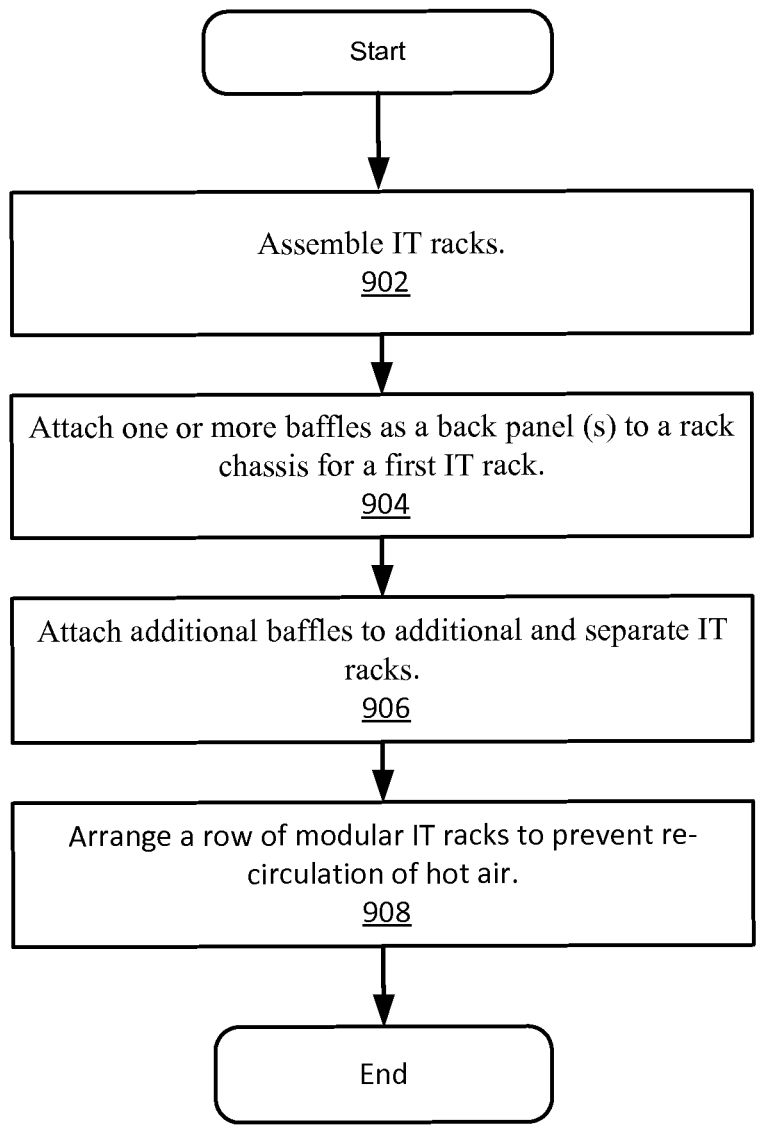
FIG. 9 is a flow chart illustrating a method for controlling air flow in a horizontally stacked arrangement of racks configured with baffles, in accordance with one or more embodiments.

FIG. 9 presents a flowchart illustrating an example method by which a HCS baffle 300 presented within the preceding figures can be utilized to implement different aspects of the disclosure. Generally, method 900 represents a method for utilizing a HCS baffle to provide air flow management within a single IT rack 100 and a row of racks 800. The description of the method is provided with general reference to the specific components illustrated within the preceding figures.

FIG. 9 illustrates an example method for controlling air flow in a horizontally stacked arrangement of racks configured with baffles. Method 900 begins at the start block and proceeds to block 902 at which a user/assembler assembles one or more IT racks 200. The user/assembler of IT racks 200 attaches one or more HCS baffles (e.g., baffles 300) as a back panel (s) to a rack chassis for a first rack and/or first vertical stack of MTGE block (block 904). The user/assembler attaches additional HCS baffles for additional and separate racks (block 906). The user horizontally stacks the first rack and the additional racks into a row of modular IT racks such that the racks are positioned horizontally adjacent to each other to prevent re-circulation of hot air received at a hot aisle of the assembly (block 908). The process ends at the end block.

In the above described flow charts, one or more of the methods may be embodied in a computer readable device containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system."

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A baffle for supporting air flow management in an information handling system (IHS) having an information technology (IT) rack, the baffle comprising:
   a panel made of a non-porous material having at least one aperture that operates as an air flow directing (AFD) section with inward-facing flanges to direct cooling air flow from heat dissipating electronic components of the IHS, the panel providing a separation of (i) a cold aisle located towards a front section of the IT rack and the electronic components inserted into a chassis of the IT rack (rack chassis) from (ii) a hot aisle located towards a rear of the IT rack;
   wherein the baffle is attached to a rear section of the rack chassis, wherein the inward-facing flanges of the AFD section folds inward towards the electronic components to create a funnel for receiving and directing a flow of exhaust air from the rack chassis, wherein the flanges of the AFD section can be adhered to the rear section of an interior of the rack chassis;
   wherein the AFD section comprises apertures that are cutout sections having the inward-facing flanges folded inwards and extending from the panel towards the electronic components and located at vertical locations along the baffle at which hot air exhaust from functioning electronic components can be directed away from an interior section of the IT rack holding the electronic components; and
   wherein the baffle is constructed from a lightweight, but rigid material and provides both air flow support and structural rigidity to the rear of the IT rack.

2. The baffle of claim 1, wherein:
   the baffle is implemented as a back panel for the IT rack which houses the IHS.

3. The baffle of claim 1, wherein the baffle is constructed from corrugated cardboard.

4. The baffle of claim 1, wherein:
   the front section of the IT rack extending towards an interior facing side of the baffle represents the cold aisle and the rear section of the IT rack on an opposite side of the baffle represents the hot aisle, and the baffle prevents hot air that is directed through the AFD apertures from re-circulating into the front section of the IT rack.

5. An information technology (IT) rack comprising:
a chassis having an IT gear holding section and a rear section, the IT gear holding section configured to hold at least one heat dissipating electronic component; and
at least one baffle for supporting air flow management and having at least one air flow directing (AFD) section that has inward-facing flanges to direct exhaust air flow from the at least one heat dissipating electronic component;
wherein the at least one baffle is attached to the rear section of the chassis of the IT rack, wherein the inward-facing flanges of the AFD section folds inward towards the electronic components to create a funnel for receiving and directing a flow of cooling air originating from a cold aisle, wherein the flanges of the AFD section can be adhered to the rear section of an interior of the chassis;
wherein the AFD section comprises apertures that are cutout sections having the inward-facing flanges folded inwards and extending from the panel towards the electronic components and placed at vertical locations along the baffle at which hot air exhaust from functioning electronic components can be directed away from the IT gear holding section of the IT rack holding the electronic components; and
wherein the baffle is constructed from a lightweight, but rigid material and provides both air flow support and structural rigidity to a rear of the IT rack.

6. The IT rack of claim 5, wherein: the chassis of the IT rack has one or more IT gear chasses; and the at least one baffle is attached to the rear section of the IT rack to separate air flow around the electronic components from air flow at the rear section of the IT rack.

7. The IT rack of claim 5, further comprising:
a stacked arrangement of modular tray grouping and enclosure (MTGE) blocks, each MTGE block having:
an exterior perimeter casing providing a volumetric, vertical space with lateral sides defining the vertical space extending between a front opening and a rear opening of the casing, the casing created with defined foldable corners/edges that enable the casing to be flat packed for shipping and then reconfigured via the lateral sides to a vertical orientation that provides the vertical space; and
a plurality of trays comprised of a lightweight material constructed with a contiguous surface material having foldable corners/edges that enable the tray to be (i) flat packed and (ii) extendable into a rectangular shaped volume within which an electronic component can be inserted, wherein the plurality of trays are stacked vertically within the volumetric, vertical space of the exterior perimeter casing;
a plurality of corner components positioned vertically at each of four corners of the stacked arrangement of MGTE blocks and which provides vertical rigidity to the rack assembly; and
at least one banding component that extends horizontally around the perimeter of the stacked arrangement of MGTE blocks to fixably hold each of the corner components in place and provide lateral support for the exterior perimeter casing;
wherein the at least one banding component and the plurality of corner components are positioned to respectively provide structural stability in a horizontal plane and vertical rigidity in a vertical plane.

8. An information technology (IT) rack comprising:
a chassis having an IT gear holding section and a rear section, the IT gear holding section configured to hold at least one heat dissipating electronic component; and
at least one baffle for supporting air flow management and having at least one air flow directing (AFD) section that has flanges to direct exhaust air flow from the at least one heat dissipating electronic component;
wherein the at least one baffle is attached to the rear section of the chassis of the IT rack, wherein the flanges of the AFD section folds inward towards the electronic components to create a funnel for receiving a flow of cooling air originating from a cold aisle, wherein the flanges of the AFD section can be adhered to the rear section of an interior of the chassis;
wherein the baffle is constructed from a lightweight, but rigid material and provides both air flow support and structural rigidity to a rear of the IT rack; and
wherein the at least one baffle comprises two baffles affixed to upper and lower areas of the rear section of the IT rack, respectively, each extending vertically to cover corresponding parts of the rear section of the IT rack.

9. The IT rack of claim 8, wherein the at least one baffle provides a separation of (i) the cold aisle located towards a front section of the rack and the electronic components inserted into the IT gear holding section from (ii) a hot aisle located towards the rear of the IT rack.

10. The IT rack of claim 9, wherein the IT rack is one of a plurality of IT racks which are stacked horizontally to provide a row of racks, each rack having baffles attached to the rear sections of the respective chasses, wherein each of the racks is individually positioned to abut an adjacent IT rack to remove air gaps between any of the adjacent IT racks, wherein the horizontally stacked row allows air flow in a first direction from the cold aisle towards the hot aisle and prevents and/or minimizes re-circulation of hot air from the hot aisle back towards the cold aisle.

11. The IT rack of claim 9, wherein:
the IT gear holding section of the IT rack adjacent to an interior facing side of the at least one baffle represents the cold aisle and the rear section of the IT rack on an opposite side of the at least one baffle represents the hot aisle, and the at least one baffle prevents hot air that is directed through the AFD apertures from re-circulating into the cold aisle section of the IT rack.

12. The IT rack of claim 8, wherein the electronic components constitute an information handling system.

13. The IT rack of claim 8, wherein the at least one baffle is constructed from corrugated cardboard and the AFD apertures are cutout sections placed at vertical locations along the baffle at which the exhaust air flow from functioning electronic components can be directed away from the IT gear holding section of the IT rack.

14. A method for directing airflow within a rack-based information handling system, the method comprising:
attaching at least one air flow management ducting component to a rear of an IT rack assembly to provide hot aisle and cold aisle separation, wherein the at least one air flow management ducting component includes at least one baffle, each baffle having a plurality of air flow directing (AFD) sections that have inward-facing flanges which direct exhaust air flow from heat dissipating IT gear located within a volumetric vertical space of the IT rack assembly, wherein the at least one baffle is attached to a rear section of a chassis of the IT rack assembly, wherein the inward-facing flanges of the AFD section folds inward towards the heat dissipating IT gear to create a funnel for receiving a flow of cooling air originating from the cold aisle, wherein the flanges of the AFD section can be adhered to the rear section of an interior of the chassis; wherein the AFD comprises apertures that are cutout sections having the inward-facing flanges folded inwards and extending from a panel towards the heat dissipating IT gear and placed at vertical locations along the baffle at which hot air exhaust from functioning heat dissipating IT gear can be directed away from an interior section of the IT rack assembly holding the heat dissipating IT gear and wherein the baffle is constructed from a lightweight, but rigid material and provides both air flow support and structural rigidity to the rear of the IT rack assembly.

15. The method of claim 14, further comprising:
attaching the baffle to the rear section of the chassis of the IT rack assembly, where the AFD sections fold inward to be adhered to the rear section and to operate as funnels directing an air flow from the volumetric vertical space of the IT rack assembly out to the rear of the IT rack assembly and preventing re-circulation of exhaust air from the rear of the IT rack assembly to the interior of the IT rack assembly.

16. The method of claim 15, further comprising:
horizontally stacking a plurality of racks to provide a row of racks, each rack having baffles attached to the rear sections of a respective rack chassis, wherein each of the racks is individually positioned to abut any adjacent IT rack to minimize air gaps between any two adjacent IT racks, wherein the horizontally-stacked row of baffle-configured IT racks allows air flow in a first direction from the cold aisle towards the hot aisle and prevents and/or minimizes re-circulation of hot air from the hot aisle back towards the cold aisle.

* * * * *